(12) United States Patent
Hanna

(10) Patent No.: US 9,356,372 B2
(45) Date of Patent: May 31, 2016

(54) TECHNIQUES TO CONVERT SIGNALS ROUTED THROUGH A FABRIC CABLE ASSEMBLY

(71) Applicant: Intel Corporation, Santa Clara, CA (US)

(72) Inventor: Timothy Glen Hanna, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 14/140,774

(22) Filed: Dec. 26, 2013

(65) Prior Publication Data

US 2015/0147895 A1    May 28, 2015

Related U.S. Application Data

(60) Provisional application No. 61/907,759, filed on Nov. 22, 2013.

(51) Int. Cl.
    *H01R 12/79*     (2011.01)
    *H01R 12/71*     (2011.01)
    H01R 13/627    (2006.01)
    H01R 24/60     (2011.01)
    H05K 1/02      (2006.01)

(52) U.S. Cl.
    CPC .............. *H01R 12/79* (2013.01); *H01R 12/716* (2013.01); *H01R 13/6272* (2013.01); *H01R 24/60* (2013.01); *H05K 1/0243* (2013.01); *H05K 2201/10189* (2013.01); *Y10T 29/49117* (2015.01)

(58) Field of Classification Search
    CPC ............... H01R 12/79; H01R 13/6271; H01R 13/6591; H01R 23/7068; H01R 23/725; H01R 24/50; H01R 24/68; H01R 43/26; H01R 4/66
    USPC .............. 439/62, 607, 607.01, 108, 352, 353, 439/358, 487, 581, 493, 497, 76.1
    See application file for complete search history.

(56) References Cited

U.S. PATENT DOCUMENTS

| | | | | |
|---|---|---|---|---|
| 6,394,824 | B1 * | 5/2002 | Huang | 439/108 |
| 6,431,887 | B1 * | 8/2002 | Yeomans et al. | 439/108 |
| 7,290,330 | B2 * | 11/2007 | Sardella et al. | 29/832 |
| 7,845,975 | B2 * | 12/2010 | Cheng et al. | 439/541.5 |
| 8,083,417 | B2 * | 12/2011 | Aronson et al. | 385/92 |
| 8,419,444 | B2 * | 4/2013 | Kagan et al. | 439/76.1 |
| 2014/0206230 | A1 * | 7/2014 | Rost et al. | 439/607.01 |
| 2014/0322932 | A1 * | 10/2014 | Tran et al. | 439/59 |

* cited by examiner

*Primary Examiner* — Amy Cohen Johnson
*Assistant Examiner* — Milagros Jeancharles
(74) *Attorney, Agent, or Firm* — Alpine Technology Law Group LLC

(57) ABSTRACT

Examples are disclosed for converting signals routed through a fabric assembly. In some examples, a connector housing may house a paddle card having a first edge portion coupled to a twin-axial cable having first signal pathways capable of routing first signals to/from a fabric controller integrated with a processor/processor package. The paddle card may have a second edge portion that may couple with an external fabric connector including a second plurality of signal pathways. In some examples, first signals received at the first edge portion may be converted to second signals following a coupling of the second edge portion with the external fabric connector. The second signals may then be routed via the second signal pathways included in and/or coupled with the external fabric connector. Other examples are described and claimed.

25 Claims, 14 Drawing Sheets

ASSIGNMENT
600
TABLE 610

| SIGNAL TYPE | 54-PIN CONNECTOR | PINS 320 | PADS 320 |
|---|---|---|---|
| GND | 1 | 310-1 | 320-1 |
| RX_DN[1] | 2 | 310-2 | 320-2 |
| RX_DP[1] | 3 | 310-3 | 320-3 |
| GND | 4 | 310-4 | 320-4 |
| RX_DN[3] | 5 | 310-5 | 320-5 |
| RX_DP[3] | 6 | 310-6 | 320-6 |
| GND | 7 | 310-7 | 320-7 |
| GND | 13 | 310-8 | 320-8 |
| GND | 13 | 310-8 | 320-9 |
| GND | 14 | 310-9 | 320-10 |
| GND | 15 | 310-10 | 320-11 |
| GND | 15 | 310-10 | 320-12 |
| GND | 21 | 310-11 | 320-13 |
| TX_DP[4] | 16 | 310-12 | 320-14 |
| TX_DN[4] | 17 | 310-13 | 320-15 |
| GND | 18 | 310-14 | 320-16 |
| TX_DP[2] | 19 | 310-15 | 320-17 |
| TX_DN[2] | 20 | 310-16 | 320-18 |
| GND | 21 | 310-11 | 320-19 |
| GND | 28 | 310-17 | 320-20 |
| TX_DN[1] | 29 | 310-18 | 320-21 |
| TX_DP[1] | 30 | 310-19 | 320-22 |
| GND | 31 | 310-20 | 320-23 |
| TX_DN[3] | 32 | 310-21 | 320-24 |
| TX_DP[3] | 33 | 310-22 | 320-25 |
| GND | 34 | 310-23 | 320-26 |
| GND | 40 | 310-24 | 320-27 |
| GND | 40 | 310-24 | 320-28 |
| GND | 41 | 310-25 | 320-29 |
| GND | 42 | 310-26 | 320-30 |
| GND | 42 | 310-26 | 320-31 |
| GND | 48 | 310-26 | 320-32 |
| RX_DN[4] | 49 | 310-27 | 320-33 |
| RX_DP[4] | 50 | 310-28 | 320-34 |
| GND | 51 | 310-29 | 320-35 |
| RX_DN[2] | 52 | 310-30 | 320-36 |
| RX_DP[2] | 53 | 310-31 | 320-37 |
| GND | 54 | 310-32 | 320-38 |

GUIDE A FIRST EDGE PORTION OF A PADDLE CARD IN A PADDLE CARD RECEPTOR FOR AN EXTERNAL FABRIC CONNECTOR, THE PADDLE CARD RECEPTOR FIXED TO A PRINTED CIRCUIT BOARD, THE PADDLE CARD HAVING A SECOND EDGE PORTION COUPLED TO A TWIN-AXIAL CABLE INCLUDING A FIRST PLURALITY OF SIGNAL PATHWAYS TO ROUTE FIRST SIGNALS FROM A FABRIC CONTROLLER INTEGRATED WITH A PROCESSOR OR PROCESSOR PACKAGE
1002

LATCH, VIA A CONNECTOR LATCH, A CONNECTOR HOUSING THAT HOUSES THE PADDLE CARD TO A METAL ENCLOSURE FIXED TO THE PRINTED CIRCUIT BOARD SUCH THAT THE FIRST EDGE PORTION SECURELY INSERTS IN THE PADDLE CARD RECEPTOR AND THE METAL ENCLOSURE ENCLOSES AT LEAST A PORTION OF THE CONNECTOR HOUSING THAT HOUSES THE PADDLE CARD
1004

CONVERT THE FIRST SIGNALS ROUTED VIA THE TWIN-AXIAL CABLE TO SECOND SIGNALS FOLLOWING THE LATCHING OF THE CONNECTOR HOUSING TO THE METAL ENCLOSURE, THE SECOND SIGNALS CAPABLE OF BEING ROUTED VIA A SECOND PLURALITY PATHWAYS INCLUDED IN THE EXTERNAL FABRIC CONNECTOR
1006

EJECT AT LEAST A PORTION OF THE PADDLE CARD RECEPTOR RESPONSIVE TO A DOWNWARD FORCE ON THE CONNECTOR LATCH
1008

FIG. 10

TECHNIQUES TO CONVERT SIGNALS ROUTED THROUGH A FABRIC CABLE ASSEMBLY

RELATED CASE

This application claims priority to U.S. Provisional Patent Application No. 61/907,759, filed on Nov. 22, 2013, that is hereby incorporated by reference in its entirety.

TECHNICAL FIELD

Examples described herein are generally related to connectors for fabrics used to interconnect computing devices.

BACKGROUND

Processing capabilities of processors used in such applications as high-performance computing (HPC) have been continually increasing. Networking capabilities to interconnect computing devices in an HPC environment have also been increasing. However, increases in networking capabilities are now lagging substantially behind processing capability increases. Processors in an HPC system may often sit idle while network data (e.g., packets) is transmitted or received via various types of communication links such a switch fabric.

BRIEF DESCRIPTION OF THE DRAWINGS

FIG. 6 illustrates an example assignment.
FIG. 10 illustrates an example process.

DETAILED DESCRIPTION

As contemplated in the present disclosure, processors or processor packages having multiple processor sockets that may be deployed in an HPC system may sit idle while network data is transmitted or received. An HPC system may utilize types of communication links such as a switch fabric. A package or substrate having a fabric interface controller that is separate from processors or processor packages may contribute to network delays or limit network bandwidth. As a result, fabric interface controllers for an external switch fabric may act as a bottleneck and processor computing resources may be wasted or inefficiently used.

Attempts have been made to increase numbers of communication channels and/or ports interfacing with a fabric interface controller located separately from a processor or processor package. A bottleneck may still occur via the communication link(s) between the processor or processor package and the separately located fabric interface controller. In order to eliminate this type of bottleneck, the fabric interface controller may be integrated with the processor or processor package.

In some examples, once a fabric controller is integrated with a processor or processor package, protocols and/or signal routing for an internal fabric may be proprietary-based and closed. Yet, external fabrics and electrical/optical interfaces associated with these external fabrics may be standard-based or open. A conversion of signals routed via proprietary-based signal pathways may be needed at a connecting point to convert these signals to be routed via signal pathways designed according to one or more standard-based interfaces having standardized connectors. It is with respect to these and other challenges that the examples described herein are needed.

In some examples, techniques are implemented to convert signals routed through a fabric cable assembly. For these examples, the fabric cable assembly may include a connector housing and a paddle card resident within the connector housing. The paddle card may have a first edge portion and a second edge portion that are located on opposing edges of the paddle card. The fabric cable assembly may also include a twin-axial cable including a plurality of signal pathways to route first signals, e.g., according to a proprietary-based interface. The first signals may be routed from a fabric controller integrated with a processor or processor package to the first edge portion of the paddle card. The first signals may be capable of being converted to second signals following a coupling of the second edge portion with an external fabric connector. The external fabric connector may have a second plurality of signal pathways to route the second signals, e.g., according to a standard-based interface.

Figure 1:
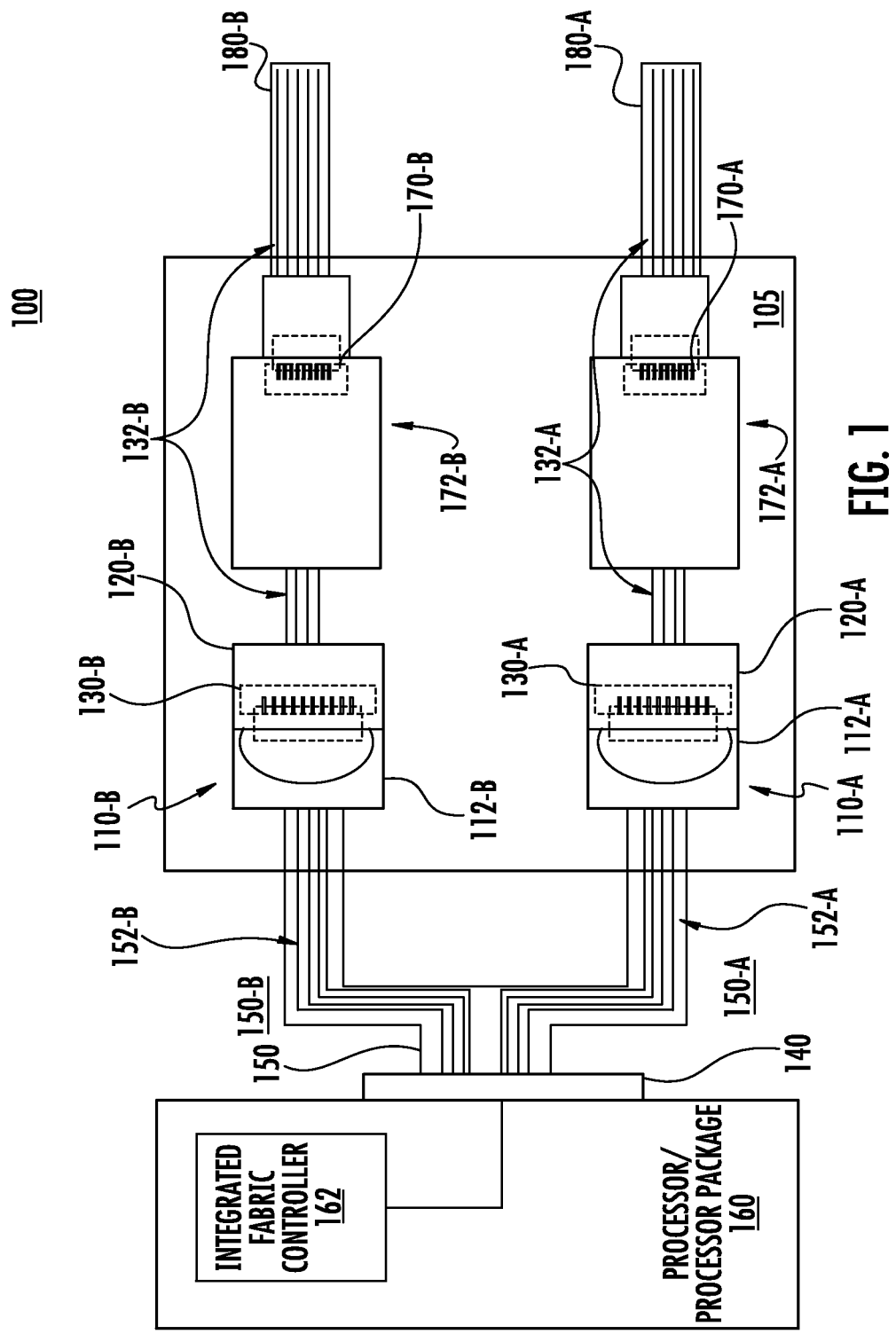
FIG. 1 illustrates an example first system.

FIG. 1 illustrates an example first system. In some examples, as shown in FIG. 1, the example first system includes system 100. For these examples, system 100 is shown in FIG. 1 as including a printed circuit board (PCB) 105 and processor/processor package 160. Also, as shown in FIG. 1, PCB 105 may have various attachable and/or embedded components to facilitate routing of signals from/to integrated fabric controller 162 at processor/processor package 160 to/from one or more external fabric connectors such as external fabric connectors 180-A or 180-B.

In some examples processor/processor package 160 may include any of various commercially available processors, including without limitation one or more of an AMD® Opteron® processor; an IBM® POWER® processor; an NVidia® Tesla® graphics processing unit (GPU); an Intel®, Itanium® or Xeon® processor; or similar types of high performance computing processors or co-processors. Dual microprocessors, multi-core processors or GPUs, and other types of high performance computing architectures may also be included in processor/processor package 160.

In some examples, integrated fabric controller 162 may be included on the same die as one or more of the above-mentioned types of commercially available processors or co-processors. Included on the same die may mean separate logic maintained on the same die or may include integration at a transistor layer similar to some types of integrated memory controllers present on some types of commercially available processors or co-processors. As a result of integration, a direct network or fabric connection to a processor or co-processor is enabled. An integrated fabric controller 162 may have some functionality that may enable a fabric interconnect to serve as a sort of new chipset for scalable computing that may scale across several networked computing systems and/or devices.

According to some examples, a twin-axial (twinax) cable such as twinax 150 may couple directly to integrated fabric controller 162 via connector 140 and may include signal pathways 152-A passing through branch 150-A of twinax cable 150 or signal pathways 152-B passing through branch 150-B of twinax cable 150. For these examples signal pathways 152-A or 152-B may route signals directly to/from integrated fabric controller 162. As shown in FIG. 1, signal pathways 152-A or 152-B may terminate at respective connectors 110-A or 110-B.

In some examples, as described more below, connectors 110-A or 110-B may be capable of converting the first signals to second signals following a coupling of components of connectors 110-A or 110-B with respective external fabric connectors 180-A or 180-B. For example, as shown in FIG. 1, respective signal pathways 132-A and 132-B may route the second signals from respective paddle card receptors 130-A and 130-B that are depicted as dashed-line boxes to show how these receptors may be positioned underneath metal enclosures 120-A and 120-B. The second signals may then be routed to respective receptacles 170-A and 170-B that are also depicted as dashed-line boxes to show how these receptacles may be positioned underneath cages 172-A and 172-B. The second signals may be further routed through respective external fabric receptacles 170-A and 170-B to respective external fabric connectors 180-A and 180-B according to a standard-based electrical and/or optical interface.

In some examples, metal enclosures or cages such as metal enclosures 120-A or 120-B shown in FIG. 1 as covering respective paddle card receptors 130-A and 130-B may each be capable of blocking electromagnetic interference (EMI) possibly resulting from high frequency signals being routed through connectors 110-A and 110-B. These high frequency signals may subsequently be routed through respective paddle card receptors 130-A and 130-B. For these examples, blocking of EMI may be needed to pass country-specific electromagnetic compatibility (EMC) requirements. Cages 172-A and 172-B may also block EMI and may enable system 100 and/or individual components of system 100 to pass EMC requirements when in full operation.

According to some examples, as described more below, respective paddle cards housed by connector housing 112-A and 112-B may include first and second edge portions on opposing edges or sides that may be capable of converting first signals to second signals following a connection of a given edge portion to a respective paddle card receptor. For example, the given edge portion may be depicted as a dashed-line box on the connector side of connector 110-A to show how the given edge portion may be positioned underneath metal enclosure 120-A when coupling to paddle card receptor 130-A.

In some examples, the signals routed to/from integrated fabric controller 162 may be routed based on a proprietary-based interface. The signals to/from external fabric connector 180-A or external fabric 180-B may be routed based on a standard-based interface having standard-based connectors. The standard-based interface may be associated with various types of communication protocols (proprietary or standardized) that may be associated with switch fabric communication links or channels over various communication mediums to include, but not limited to, wired/electrical or optical communication mediums. In some examples, the standard-based interface may include one or more specifications associated with the Small Form Factor (SFF) Committee including SFF-8665, Rev. 1.7, published in Oct. 23, 2012, and/or later revisions or related specifications. For these examples, external fabric connectors 180-A or 180-B may be configured as a quad small form-factor pluggable+(QSFP+) pluggable solution (QSFP28) connector and receptacles 170-A or 170-B may be configured to couple with QSFP28 connectors. Examples are not limited to QSFP28 connectors and/or external fabric receptacles configured to couple with QSFP28 connectors. Other types of external fabric connectors and/or receptacles are contemplated.

Standardized communication protocols associated with a standard-based interface such as included in a QSFP28 connector may be described and/or implemented according to various standards or specifications to include but not limited to those described by the Institute of Electrical Engineers (IEEE) such as IEEE 802.3-2008, Carrier Sense Multiple Access with Collision Detection (CSMA/CD) Access Method and Physical Layer Specifications, Published in December 2008, and/or later versions (hereinafter "the Ethernet specification"), those described by the American National Standard of Accredited Standards Committee INCITS T11 Technical Committee, Fibre Channel Backbone-5 (FC-BB-5) Standard, Revision 2.0, published June 2009, and/or later versions ("hereinafter "the Fibre Channel specification"), those describe by the InfiniBand™ Trade Association, Infiniband Architecture Specification Vol. 2, Physical Specifications, Release 1.3, published November 2012, and/or later versions (hereinafter "the Infiniband specification") and/or those described by the American National Standards Institute (ANSI), Alliance for Telecommunications Industry Solutions (ATIS) T1 Technical Committee's various synchronous optical network (SONET) standards to include, but not limited to, ATIS-0900105.01.2000 (R2010), Electrical Interfaces, published in 2010 or ATIS-0900105.06, SONET: Physical Layer Specifications, published in 2012, and/or later versions (hereinafter "the SONET standard").

Figure 2A:
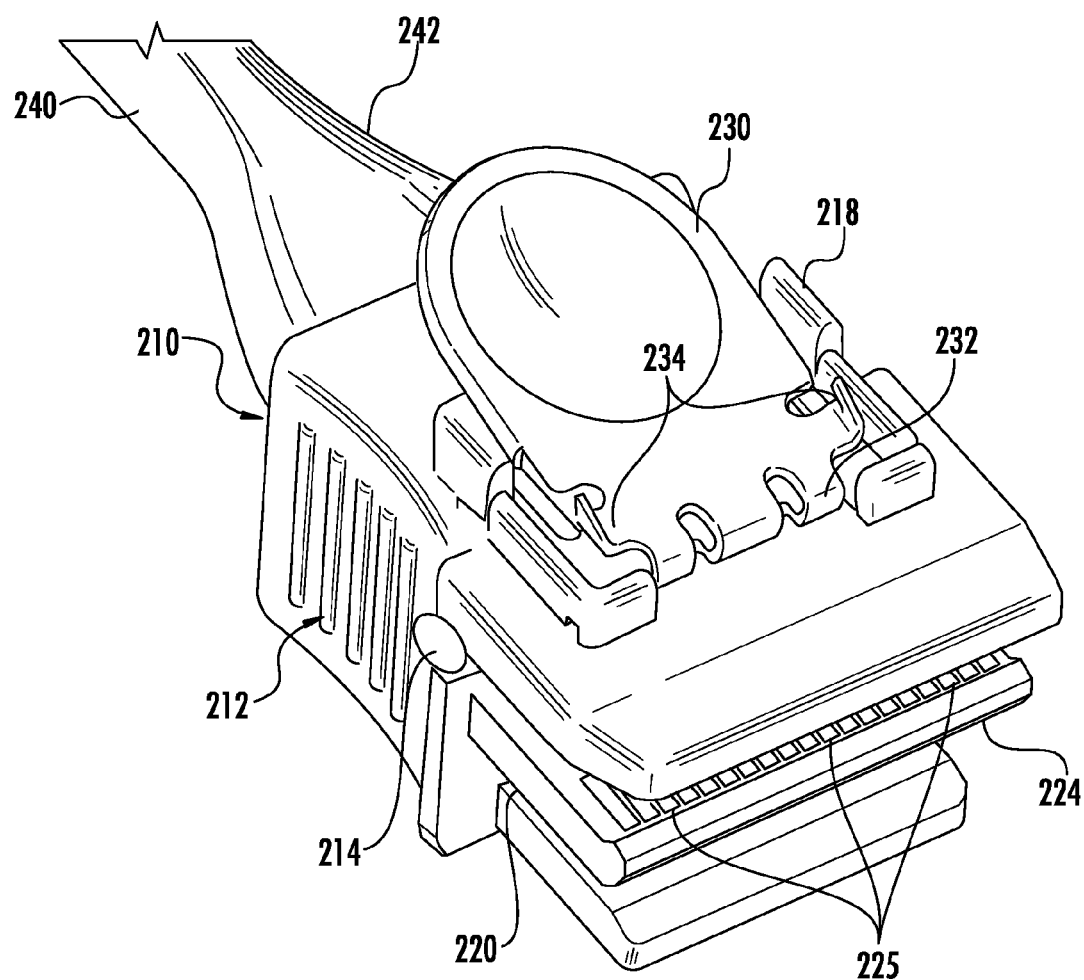
FIGS. 2A-B illustrate an example Connector.
Figure 2B:
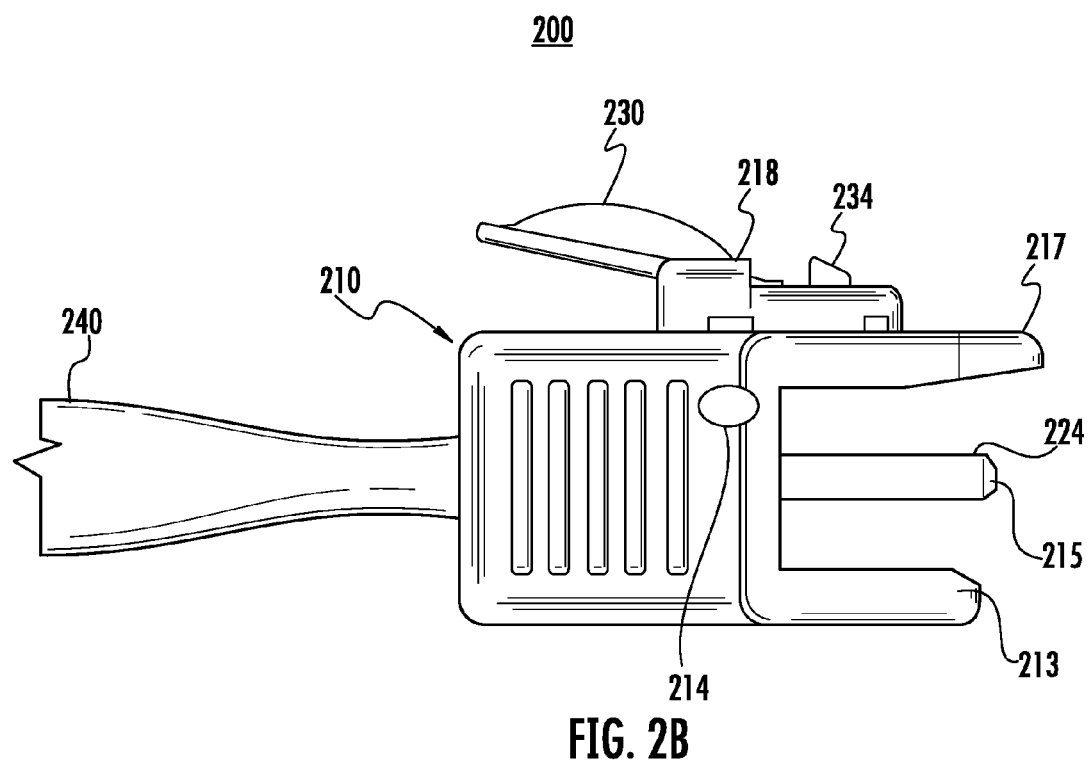

FIGS. 2A and 2B illustrate an example connector 200. According to some examples, connector 200 may be similar to connectors 110-A and 110-B shown in FIG. 1. For these examples, as shown in FIG. 2A, connector 200 may include a connector housing 210 that houses a paddle card 220, a latch 230, and a twinax cable branch 240. Although not visible in FIG. 2A, twinax cable branch 240 may include signal pathways 242 that couple with or terminate at an edge of paddle card 220 housed within connector housing 210. Signal pathways 242 may be capable of routing signals to/from a twinax cable coupled with an integrated fabric controller for a processor or processor package. As described more below, a plurality of separate communication channels may be capable of transmitting or receiving packets over first signals routed via signal pathways 242. For example, the first signals routed via signal pathways 242 may be capable of receiving/transmitting packets for four separate communication channels to/from a fabric controller integrated with a processor or processor package.

According to some examples, a second edge portion of paddle card 220 is shown in FIG. 2 as paddle card edge 224. For these examples, paddle card edge 224 is shown as including pads 225. Pads 225 may include a plurality of pads associated with and/or compliant with a standard-type electrical interface. Pads 225 may be capable of routing second signals to/from paddle card edge 224 following a coupling of paddle card edge 224 with an external fabric connector. For these examples, the second signals may have been converted from first signals routed to/from the paddle card edge housed within connector housing 210. The second signals may then be routed to/from paddle card edge 224 via a plurality of signal pathways to the external fabric connector.

According to some examples, conversion of the first signals to the second signals may be a passive conversion. The passive conversion may include converting electrical signal pathways routed from the paddle card edge housing within connector housing 210 to electrical signal pathways according to a standard-based interface. For example, receptacles and/or connectors that may be configured as QSFP28 receptacles and/or connectors.

According to some examples, conversion of the first signals to the second signals may be an active conversion. For these examples, although not shown in FIG. 2, a transceiver may be located between the paddle card edge housed within connector housing 210 and paddle card edge 224. Also, rather than pads at paddle card edge 224, optical ports may be included. The active conversion may include the transceiver converting electrical signals routed from the paddle card edge housed within connector housing 210 to optical signals routed via optical signal pathways that may be routed through an external fabric connector.

According to some examples, the number of separate communication channels capable of transmitting or receiving packets via the first signals may be maintained following conversion of the first signals to the second signals. For example, a set of four separate communication channels may be maintained following conversion and the set of four separate communication channels may then be routed through the external fabric connector.

In some examples, connector housing 210 may include various features to facilitate a coupling of paddle card edge 224 to a paddle card receptor. For example, as shown in FIG. 2A, finger grips 212 may facilitate an operator securely griping connector 200 during coupling or removing from the paddle card receptor. Connector housing 210 may also include a polarized keying tab 214 to help ensure that paddle card edge 224 is in a proper orientation when coupling to the paddle card receptor. Polarized keying tab 214 may have a corresponding key hole in a metal enclosure that enables paddle card edge 224 to fully couple with the paddle card receptor upon the proper orientation.

According to some examples, connector housing 210 may also include one or more insertion stops 218. For these examples, insertion stops 218 may be located on a top surface of connector housing and may be capable of stopping forward motion of connector 200 to prevent possibly excessive force being asserted on paddle card edge 224 when coupling to the paddle card receptor. Insertion stops 218 may be arranged such that they come up against an edge of a metal enclosure to stop forward motion of connector 200.

In some examples, as shown in FIG. 2A, a latch 230 may be connected or attached to connector housing 210 via hinge 232. Also, as shown in FIG. 2, latch 230 may include latch retention features 234. Latch retention features 234 may be capable of being received in slots in a metal enclosure. Latch 230 may be composed of a rigid material that has some flexibility (e.g., metal) that may become spring-loaded as latch retention features 234 are received in the slots of the metal enclosure and may than rise to an angled position relative to the surface of connector housing 210. Also, following receipt of latch retention features 234 in the slots, paddle card edge 224 may now be securely coupled to a paddle card receptor. According to some examples, during a decoupling of paddle card edge 224, a downward force on latch 230 may cause the spring-loaded material of latch 230 to at least partially eject paddle card edge 224 from the paddle card receptor.

As shown in a side-view of connector 200 in FIG. 2B, lower chamfer 213, middle chamfer 215 and upper chamfer 217 may facilitate a coupling of paddle card edge 224 to a paddle card receptor. In some examples, upper chamfer 217 and lower chamfer 213 may assist an operator in at least a coarse aligning of paddle card edge 224 to the paddle card receptor. Also, middle chamfer 215 may allow for a somewhat finer alignment of paddle card edge 224 to the paddle card receptor. Further, polarized keying tab 214 may ensure that the proper orientation is maintained during the insertion.

Figure 3:
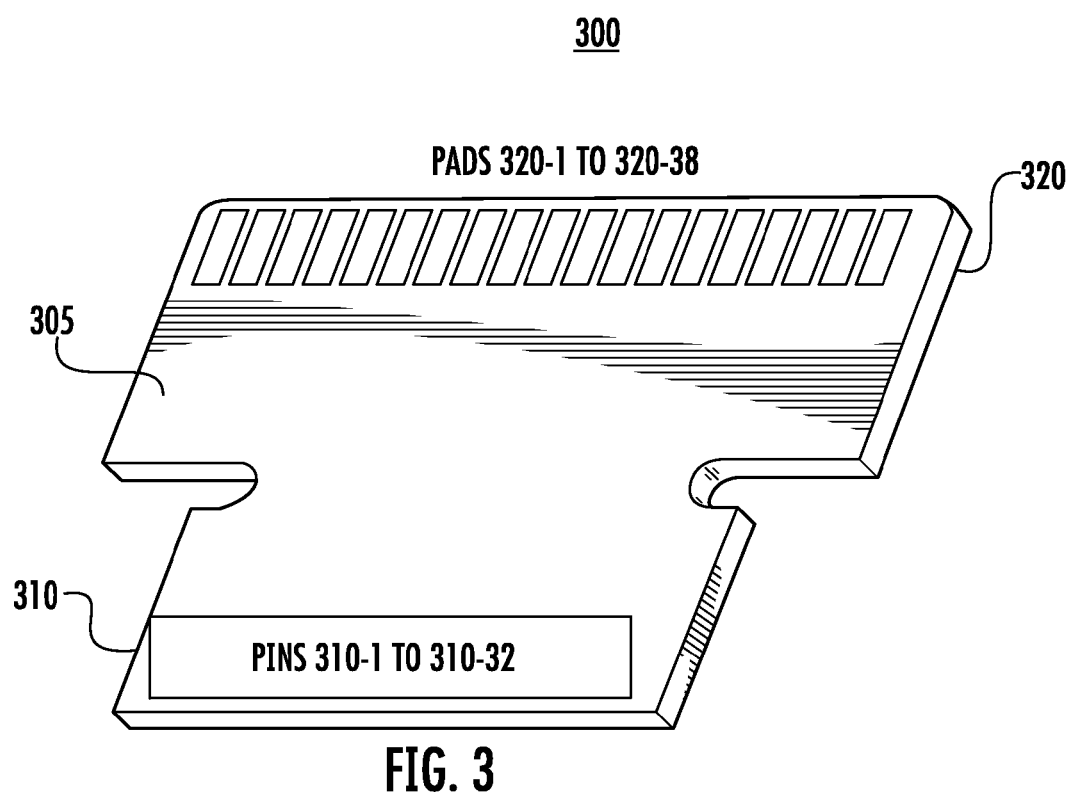
FIG. 3 illustrates an example paddle card.

FIG. 3 illustrates an example paddle card 300. According to some examples, as shown in FIG. 3, paddle card 300 includes a substrate 305 and paddle card edges 310 and 320 located on opposing edges. Also shown in FIG. 3 are pins 310-1 to 310-32 at paddle card edge 310 and pads 320-1 to 320-38 at paddle card edge 320. For these examples, pins 310-1 to 310-32 may couple to signal pathways routed via a first twinax cable branch to/from a fabric controller integrated with a processor or processor package. The first twinax cable branch may be associated with a first port. A second twinax cable branch may be associated with a second port.

In some examples, pins 310-1 to 310-32 at paddle card edge 310 may originate from a 54-pin connector coupled to a fabric controller integrated with a processor or processor package. For these examples, separate signal pathways each capable of routing four communication channels may be routed through separate branches of the twinax cable associated with separate ports. For example, each communication channel may include a total of two differential signal pairs, one pair for receiving data signals and another pair for transmitting data signals. Thus, each communication channel may be routed to four pins and four communication channels would equate to 16 pins of pins 310-1 to 310-32 assigned to route these four communication channels. Ground signals may be assigned to the remaining 16 pins of pins 310-1 to 310-32.

In some examples, pads 320-1 to 310-38 at paddle card edge 320 may couple to signal pathways routed to/from an external fabric connector. As described more below, pin-to-pad assignments and layouts for pins 310-1 to 310-32 to pads 320-1 to 320-38 may enable first signals routed via first signal pathways included in the twinax cable branch from a fabric controller to be converted to second signals routed via second signal pathways through an external fabric connector. The pin-to-pad assignments described more below indicate that some ground signal paths are replicated from pins 310-1 to 310-32 to accommodate the six pin-to-pad differential between paddle card edge 310 and paddle card edge 320.

Figure 4:
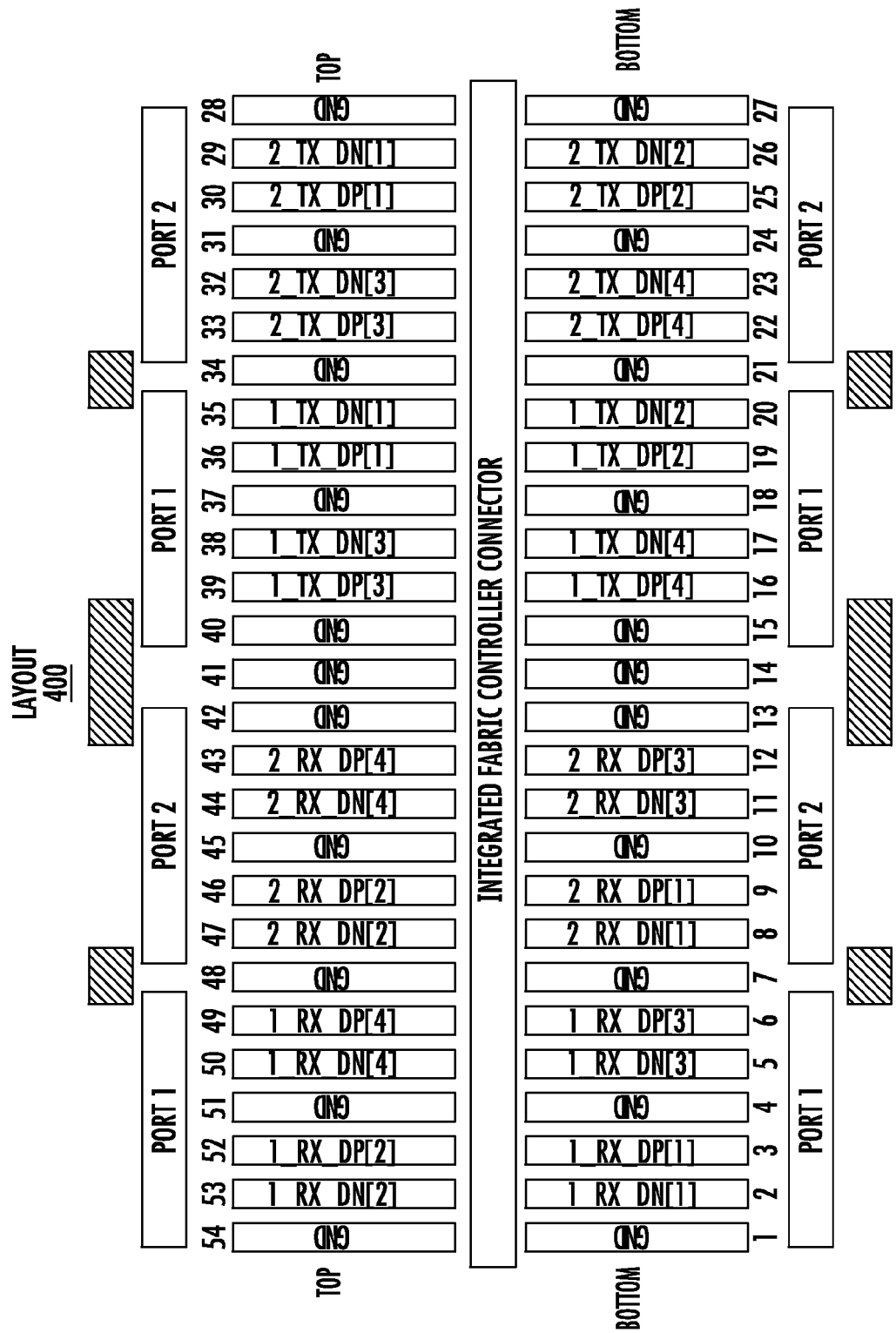
FIG. 4 illustrates an example first layout.

FIG. 4 illustrates an example layout 400. In some example, layout 400 may be for a 54-pin connector coupled directly to a fabric controller integrated with a processor or processor package. As shown in FIG. 4, layout 400 shows a view as if a two-sided connecter was flattened with the top being the top side of the connector as viewed from a receptacle for receiving the connector at the fabric controller. As mentioned above, in some examples, separate signal pathways each capable of routing four communication channels may be routed through separate branches of the twinax cable associated with separate ports. As shown in FIG. 4, the separate ports may include port 1 and port 2. Layout 400 is an example layout and examples are not limited to layout 400 for routing signals through various pins of a connector coupled directly with a fabric controller integrated with a processor or processor package.

According to some examples, as shown in FIG. 4 for layout 400, a total of 10 ground signals are replicated between the ports 1 and 2 as indicated by the shaded areas above pins for replicated ground signals. For example, ground (GND) signals for pins 13, 14 and 15 may be shared or replicated between ports 1 and 2. Also, six ground and 16 data signals may be separately routed to each of the ports to result in a total of 32 signal paths for each port. In some examples, "DIV" may represent differential negative and "DP" may represent differential positive. Also "TX" may represent transmit and "RX" may represent receive.

Figure 5:
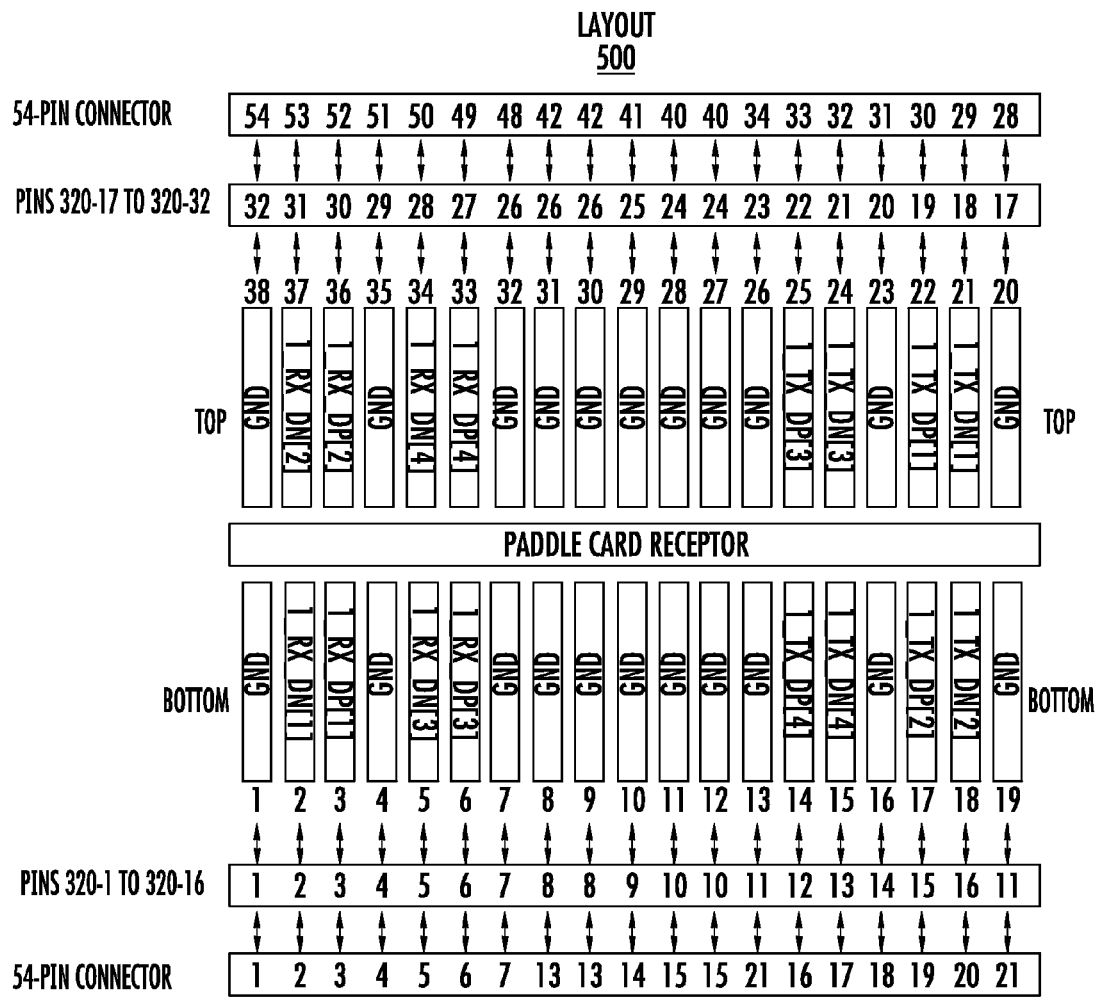
FIG. 5 illustrates an example second layout.

FIG. 5 illustrates an example layout 500. In some examples, layout 500 may be for a first paddle card edge similar to paddle card edge 320 of paddle card 300 that has pads 320-1 to 320-38. For these examples, FIG. 5 shows a mapping of the signals from the 54-pin connector as mentioned above for FIG. 4 to pins 1-32 that may be for a second paddle card edge of paddle card 300 similar to paddle card edge 310. Layout 500 shows a view as if a paddle card edge 320 was flattened with the top being the top side of the paddle card edge as viewed from a paddle card receptor configured to receive or couple with paddle card edge 320.

According to some examples, as shown in FIG. 5, a total of four communication channels may be routed over signal pathways coupled with various pins or coupling points on paddle card edge 310. Each communication channel may include a total of two differential data signal pairs routed through four pins. For example, as shown in FIG. 5, a first receive differential data signal for communication channel 1 (RX_DN[1]) originating from pin 2 of the 54-pin connector may be routed through pin 310-2 to pad 320-2. A second receive differential data signal (RX_DP[1]) originating from pin 2 may be routed through pin 310-3 to pad. Also, a first transmit differential data signal for communication channel 1 (TX_DN[1]) originating from pin 29 may be routed through pin 310-18 to pad 320-21 and a second transmit differential data signal (TX_DP [1]) originating from pin 30 may be routed through pin 310-219 to pad 320-22.

In some examples, various ground signal paths at pins from among pins 310-1 to 310-32 may be replicated when routed to pads from among pads 320-1 to 320-38. For example, GND signals for pins 310-8, 10, 11, 24 and 26 may be replicated as shown in FIG. 5 for layout 500. Layout 500 is an example layout and examples are not limited to layout 500 for routing signals originating from a 54-connector coupled directly with a fabric controller integrated with a processor or processor package.

FIG. 6 illustrates an example assignment 600. In some examples, as shown in FIG. 6, assignment 600 includes a table 610. For these examples, table 610 depicts a table view of the mapping of pins from the 54-pin connector to pads at paddle card edge 320 that were assigned according to layout 500.

In some examples, first signals may be routed from a twinax cable branch associated with port 1 via a first plurality of signal pathways coupled with pins 310-1 to 310-32. For these examples, the first signals may be converted to second signals as a result of converting the 32 pins routed from the 54-pin connector to paddle card edge 310 to the 38 pads on paddle card edge 320. So for these examples, first signals received at paddle card edge 310 may be converted to second signals and routed to pads 320-1 to 320-38 at paddle card edge 320. According to some examples, the second signals may then be routed via a second plurality of signal paths that now includes 38 signal paths, one each for pads 320-1 to 320-38. At least a portion of these 38 signal paths may be included in a second plurality of signal paths that may then be routed through an external fabric connector. As mentioned above for FIG. 1, the external fabric connector may couple with a paddle card edge through a paddle card receptor that couples with an external fabric receptacle configured to receive the external fabric connector.

Figure 7A:
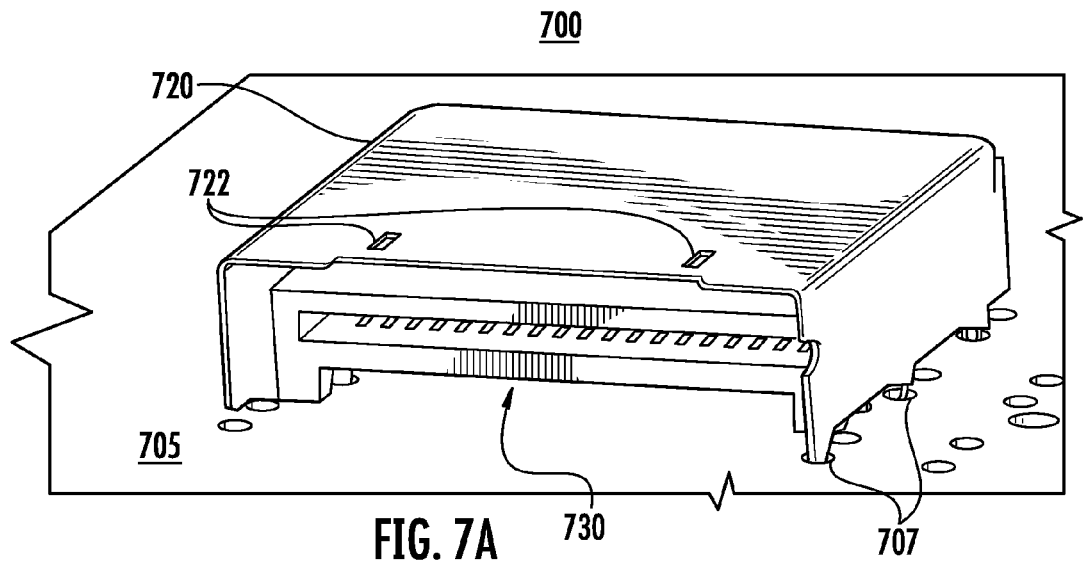
FIGS. 7A-D illustrate an example second system.

FIGS. 7A-D illustrate an example second system. In some examples, as shown in FIGS. 7A-D, the example second system includes a system 700. For these examples, different components of system 700 are depicted in FIGS. 7A-D in various stages of coupling or connection to a PCB 705. For example, FIG. 7A shows system 700 having PCB 705 with holes 707 capable of receiving connectors of a metal enclosure 720.

In some examples, as shown in FIG. 7A, a paddle card receptor 730 may be coupled to PCB 705 such that when metal enclosure 720 is connected to PCB 705 at least four sides (top, bottom, left and right) are covered by metal enclosure 720. For these examples, metal enclosure 720 is shown as slightly transparent to depict how metal enclosure 720 may be installed on PCB 705 in relation to paddle card receptor 730. Metal enclosure 720 may be configured such that a first edge portion of a paddle card housed in a connector housing for a connector (e.g., connector 200) may be inserted in the open end of metal enclosure 720. Metal enclosure may then be capable of shielding EMI associated with signals routed through paddle card receptor 730.

According to some examples, as shown in FIG. 7A, metal enclosure 720 may include slots 722. Slots 722, as described more below, may facilitate a secure connection between a connector housing for a connector following insertion of the first edge portion of a paddle card housed in the connector housing.

Figure 7B:
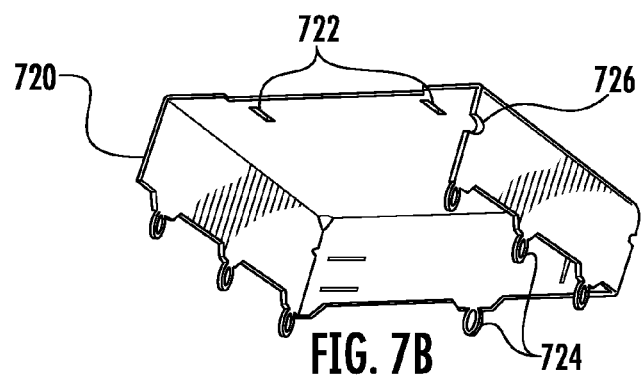

According to some examples, as shown in FIG. 7B, a perspective view of metal enclosure 720 is depicted. The perspective view is from underneath or below metal enclosure 720 as if from the view of PCB 705 prior to connection to PCB 705. For these examples, metal enclosure 720 may be connected to PCB 705 via retention pins 724 being press-fitted into holes 707. Retention pins 724 and holes 707 may be arranged such that another metal enclosure, capable of enclosing at least a portion of a second connector housing on an opposing side of PCB 705, may be press-fitted to holes on the opposing side of PCB 705. The other metal enclosure may then be arranged in a belly-to-belly configuration with metal enclosure 720.

Although not shown in FIGS. 7A-7B, in some other examples, metal enclosure 720 may be connected to PCB 705 via a solder-in connection. The solder-in connection may solder retention pins 724 to PCB 705 rather than press-fit these connectors into holes 707 as mentioned above.

In some examples, as shown in FIG. 7B, slots 722 are shown on an upper surface and a key slot 726 on a side surface or edge of metal enclosure 720. These features of metal enclosure 720 may be capable of facilitating a correct and secure connection of elements of a connector such as a paddle card edge to paddle card receptor 730.

Figure 7C:
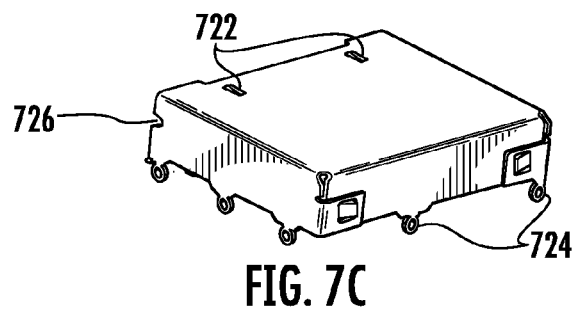

In some examples, as shown in FIG. 7C, another perspective view of metal enclosure 720 is depicted. The other perspective view is from above and from a closed or shielded side of metal enclosure 720. FIG. 7C also shows a different view of slots 722, retention pins 724 and key slot 726.

Figure 7D:
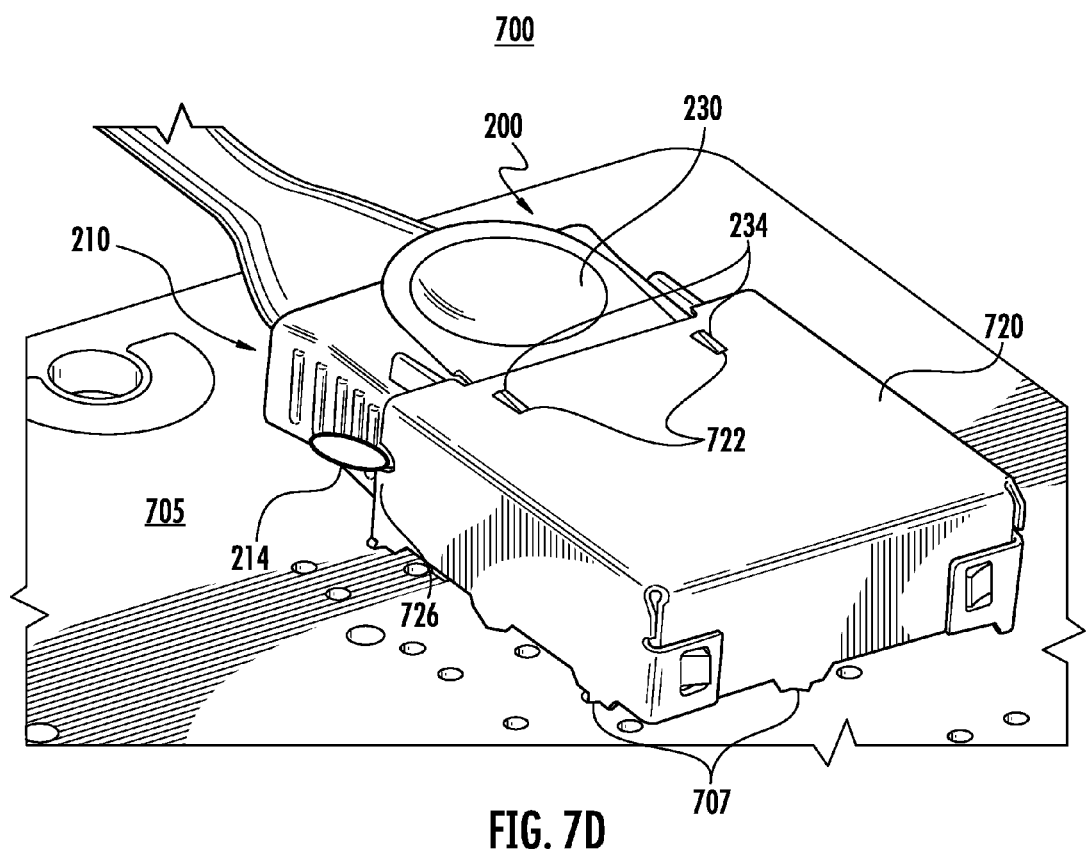

According to some examples, as shown in FIG. 7D, a connector 200 is shown having latch retention features 234 received within slots 722 of metal enclosure 720. As mentioned above for FIG. 2, latch retention features 234 may be coupled with latch 230 to facilitate a secure connection between connector housing 210 and a metal enclosure such as metal enclosure 720.

In some examples, as shown in FIG. 7D, key slot 726 may also receive polarized keying tab 214 of connector housing 210 to facilitate a correct insertion of the first edge portion of the paddle card edge housed in connector housing 210 with paddle card receptor 730.

According to some examples, a spring-loaded tension in latch 230 may cause latch 230 to rise or elevate to an angled position, e.g., approximately 45 degrees in relation to the top surface of connector housing 210 when latch retention features 234 are received in slots 722. The spring-loaded tension in latch 230 may cause the paddle card edge to decouple from paddle card receptor 730 as well as latch retention features 234 to be removed from slots 722 when a downward force towards PCB 705 is applied to latch 230.

Figure 8A:
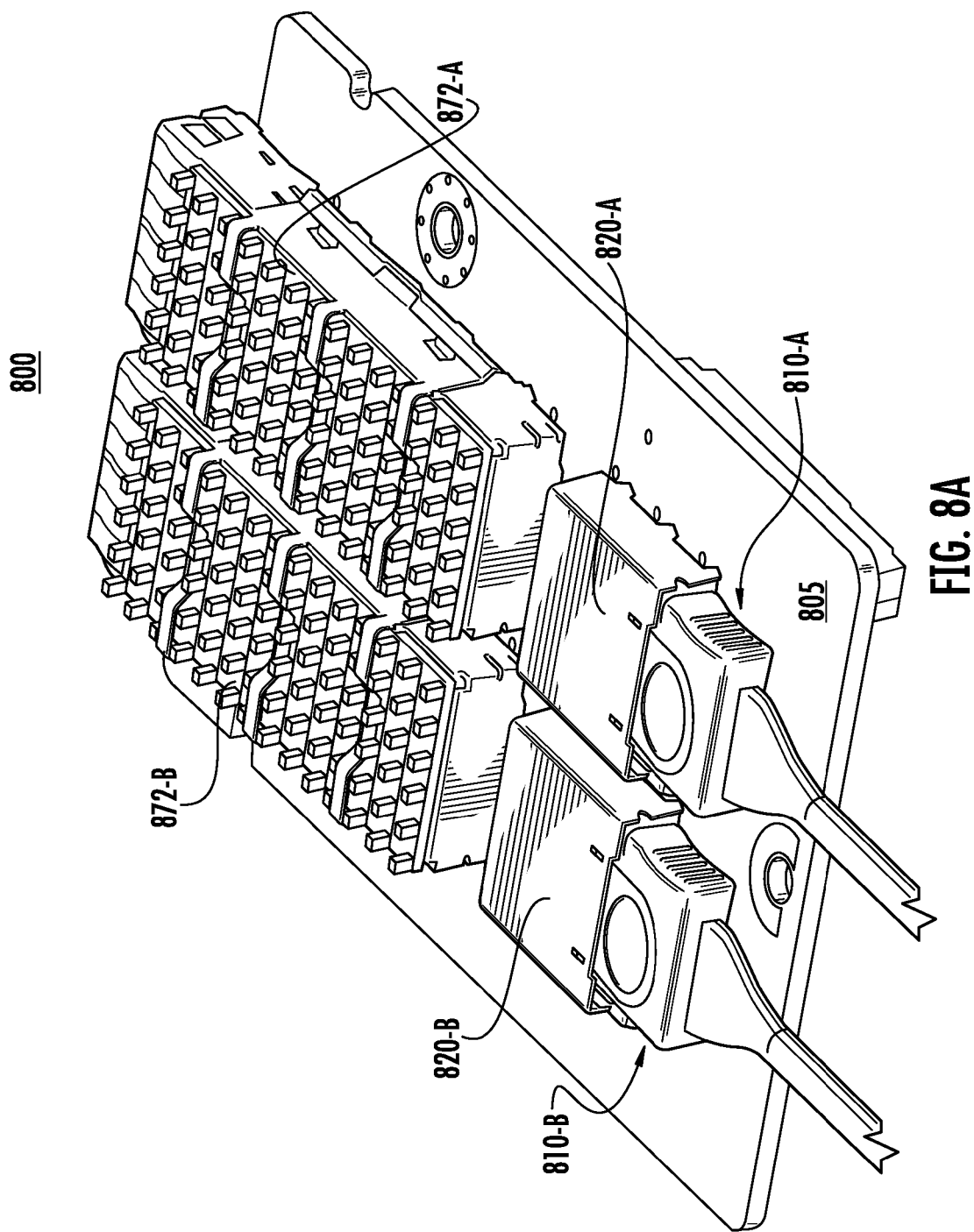
FIGS. 8A-B illustrate an example third system.
Figure 8B:
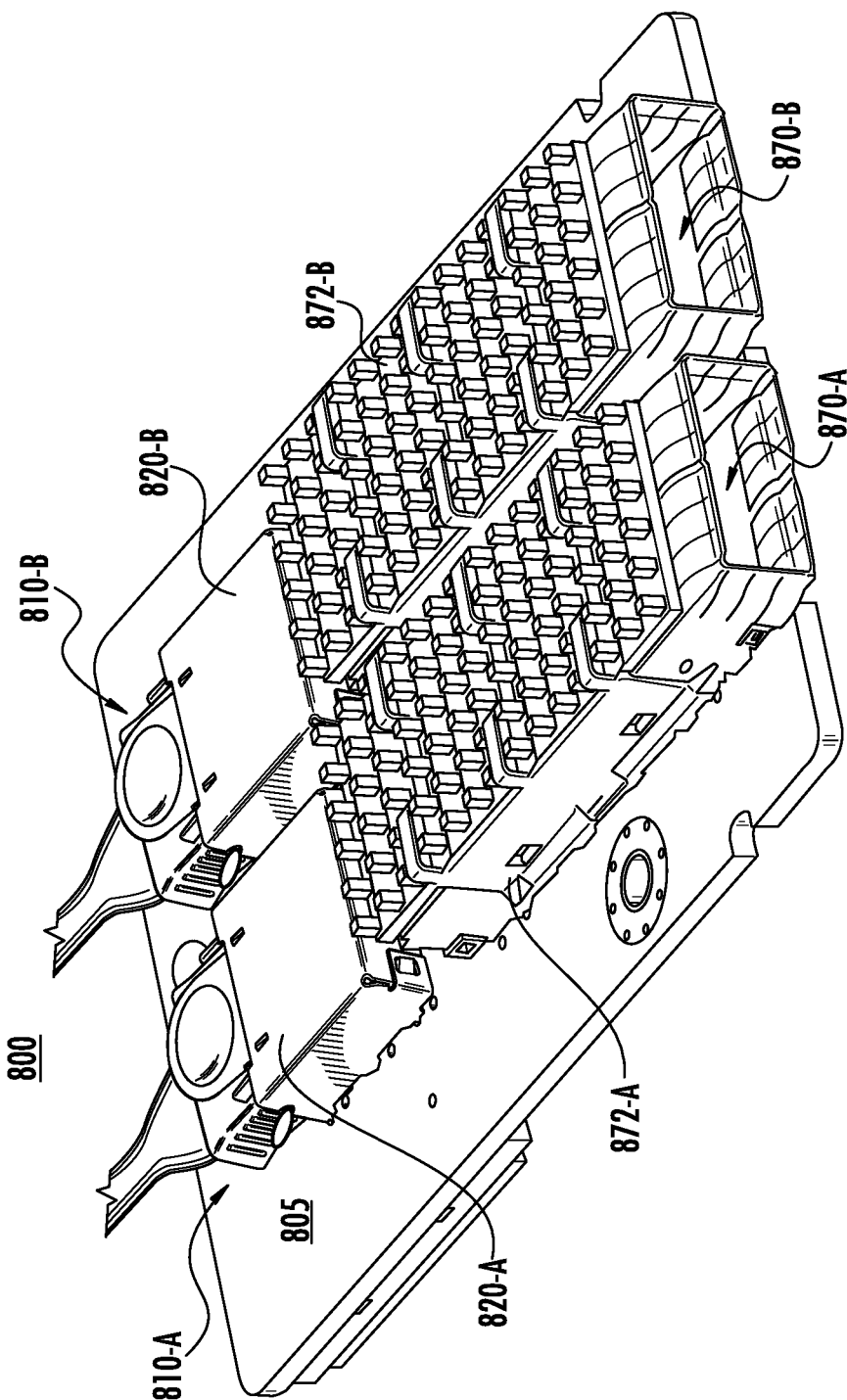

FIGS. 8A-B illustrate an example third system. In some examples, as shown in FIGS. 8A-B, the third system includes system 800. For these examples, system 800 is shown in FIG. 8A as including a PCB 805 with two connectors 810-A and 810-B having paddle card edges housed within connector housings coupled to paddle card receptors enclosed by respective metal enclosures 820-A and 820-B.

According to some examples, signal pathways from receptacles enclosed by metal enclosures 820-A and 820-B may be routed to external fabric connectors through receptacles enclosed by respective cages 872-A and 872-B. Also, signal pathways from paddle card receptors enclosed by respective metal enclosures 820-A and 820-B may couple to respective receptacles enclosed by cages 872-A and 872-B. Although not shown in FIG. 8, in other examples, the signal pathways may go through PCB 805 to an opposing side. For example, signal pathways from the paddle card receptor enclosed by metal enclosure 820-A may couple to a receptacle enclosed by a cage similar to cage 872-A on the opposing side of PCB 805.

In some examples, as shown in FIG. 8B, receptacles 870-A and 870-B may be configured to receive an external fabric connector. Receptacles 870-A and 870-B may be configured to receive external fabric connectors that may include, but are not limited to, QSFP28 connectors.

Figure 9A:
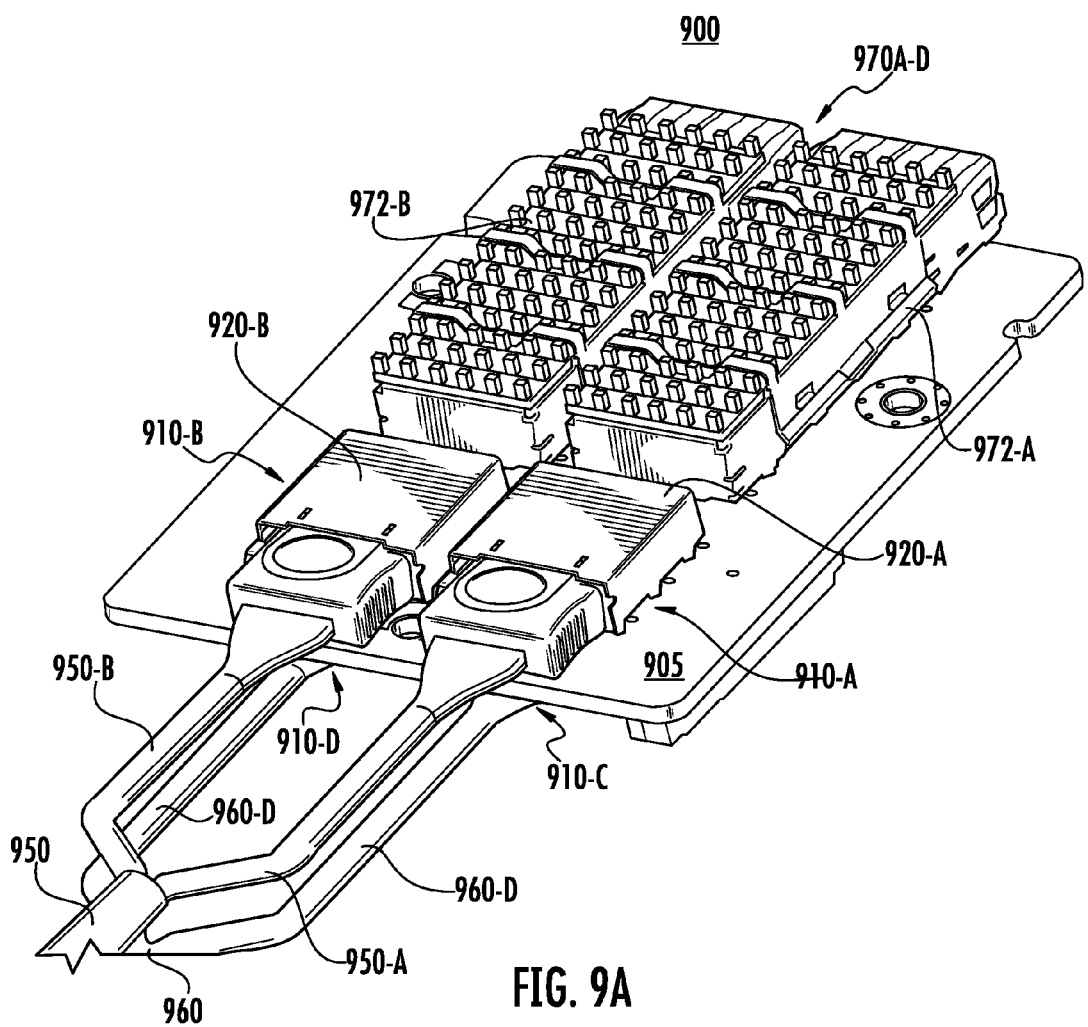
FIGS. 9A-B illustrate an example fourth system.
Figure 9B:
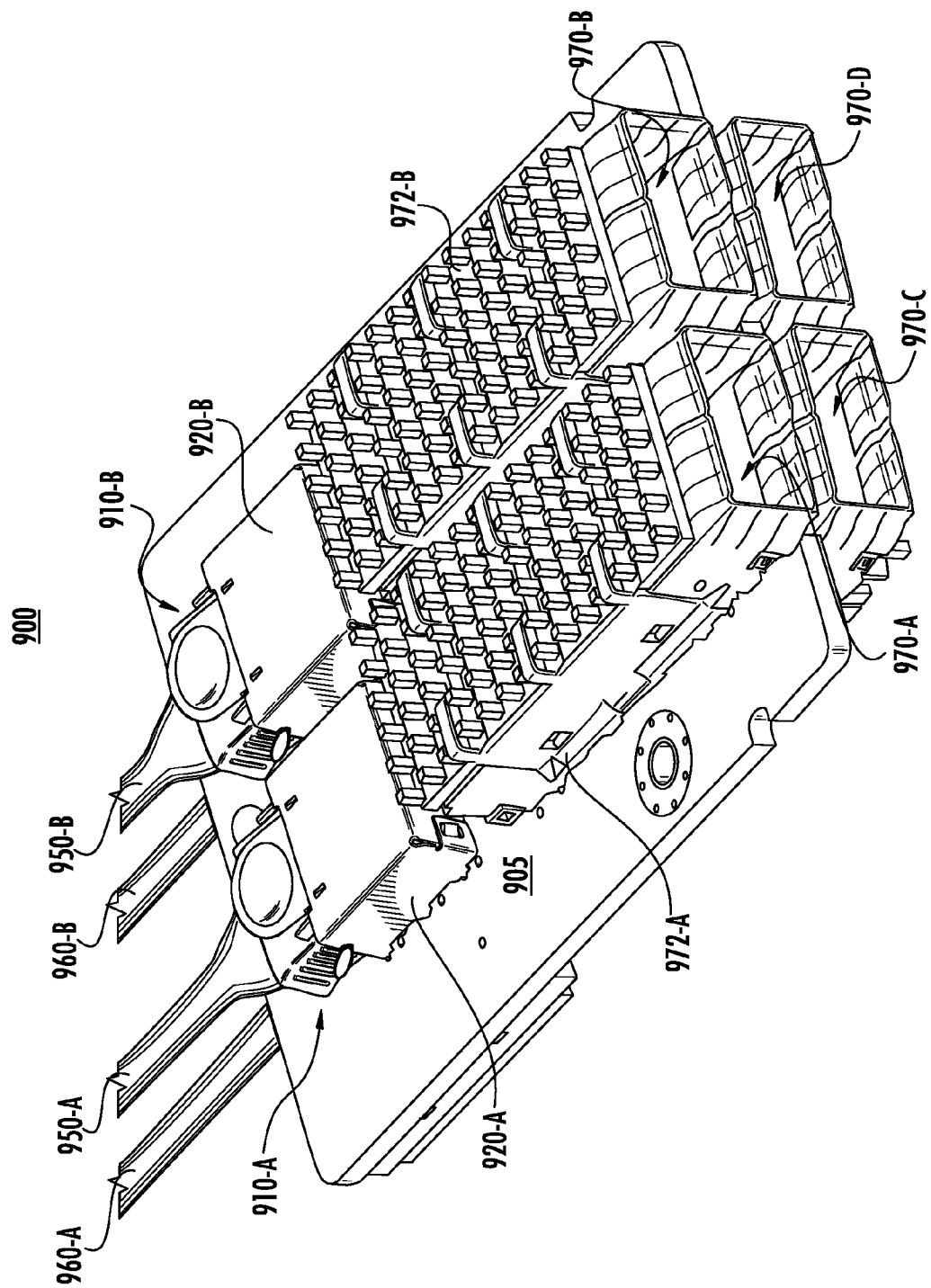

FIGS. 9A-B illustrate an example fourth system. In some examples, as shown in FIGS. 9A-B, the fourth system includes system 900. For these examples, system 900 is shown in FIG. 9A as including a PCB 905 with four connectors 910-A to 910-D. As shown in FIG. 9, connectors 910-A and 910-B may be on a side of PCB 905 visible with the perspective illustrated. Meanwhile, Connectors 910-C and 910-D may be on an opposing side of PCB 905. Also, as shown in FIG. 9, a first twinax cable 950 may have branches 950-A and 950-B that may terminate at connectors 910-A and 910-B, respectively. A second twinax cable 960 may have branches 960-C and 960-D that may terminate at connectors 910-C and 910-D, respectively. In some examples, twinax cable 950 and 960 may route separate signals from respective first and second fabric controllers integrated with one or more processors or processor packages.

According to some examples, each connector may have paddle card edges housed within connector housings coupled to paddle card receptors enclosed by respective metal enclosures 920-A to 920-D. In some examples, metal enclosures 920-A and 920-B may be arranged in a belly-to-belly configuration with metal enclosure 920-C and 920-D on opposing sides of PCB 905.

According to some examples, signal pathways from paddle card receptors enclosed by metal enclosures 920-A to 920-D may be separately routed to respective receptacles 970-A to 970-D. For these examples, as shown by another perspective view for system 900 in FIG. 9B, receptacles 970-A to 970-D may be configured to receive or couple with four separate external fabric connectors. In some examples, receptacles 970-A to 970-D may be configured to receive QSFP28 external fabric connectors.

FIG. 10 illustrates an example process 1000. Process 1000 may be representative of some or all of the operations executed by one or more features or devices described herein, such as connectors shown and described for FIGS. 1, 2 and 7-9. For example, any one of connectors 110-AB, connector 200, connectors 810-AB or connectors 910-A/B/C/D may be used to implement process 1000. However, process 1000 is not limited to the connectors shown and described for FIGS. 1, 2 and 7-9.

In the illustrated example shown in FIG. 10, process 1000 at block 1002 may guide a first edge portion of a paddle card in a paddle card receptor for an external fabric connector. For these examples, the paddle card receptor may be fixed to a PCB. The paddle card may have a second edge portion coupled to a twin-axial cable including a first plurality of signal pathways to route first signals from a fabric controller integrated with a processor or processor package.

According to some examples, process 1000 at block 1004 may latch, via a connector latch, a connector housing that houses the paddle card to a metal enclosure fixed to the PCB such that the first edge portion securely inserts in the paddle card receptor and the metal enclosure encloses at least a portion of the connector housing that houses the paddle card.

In some examples, process 1000 at block 1006 may convert the first signals routed via the twin-axial cable to second signals following the latching of the connector housing to the metal enclosure. For these examples, the second signals may be capable of being routed via a second plurality of pathways included in the external fabric connector.

According to some examples, process 1000 at block 1008 may cause an ejection of at least a portion of the paddle card receptor. For these examples, the ejection may be caused due to a spring-loading of a connector latch attached to the connector housing that may have one or more chamfers that were received in respective one or more slots of the metal enclosure. Applying a downward force on an upwardly angled connector latch may be what causes the spring-loaded connector latch to at least partially eject the first edge portion from the paddle card receptor.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled", "connected", or "capable of being coupled" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

In some examples, an example apparatus may include a connector housing. The apparatus may also include a paddle card resident within the connector housing. For these examples, the paddle card may have a first edge portion and a second edge portion. The first and second edge portions may be on opposing edges of the paddle card. The apparatus may also include a twin-axial cable including a first plurality of signal pathways to route first signals from a fabric controller integrated with a processor or processor package to the first edge portion. The first signals may be capable of being converted to second signals following a coupling of the second edge portion with an external fabric connector including a second plurality of signal pathways to route the second signals.

According to some examples, the apparatus may also include a metal enclosure capable of enclosing at least a portion of the connector housing that houses the paddle. The apparatus may also include a connector latch to secure the connector housing to the metal enclosure in a manner such that the second edge portion inserts in a paddle card receptor of the external fabric connector responsive to the connector housing being secured by the connector latch.

In some examples, the apparatus may also include the connector latch positioned on a top portion of the connector housing. The connector latch may have one or more latch retention features. For these examples, the metal enclosure may include one or more slots to receive the respective one or more latch retention features such that a secure connection between the connector housing and the metal enclosure is maintained following receipt of the one or more latch retention features in the respective one or more slots.

According to some examples for the apparatus, the connector latch may be capable of being spring-loaded in an upwardly angled position following receipt of the one or more latch retention features in the respective one or more slots such that a downward force on the connector latch causes the one or more latch retention features to disengage from the respective one or more slots in the metal enclosure and also cause the second edge portion to at least partially eject from the paddle card receptor.

In some examples for the apparatus, the connector housing may include a polarized keying tab to facilitate correct insertion of the second edge portion in the paddle card receptor. For these examples, the metal enclosure may be capable of receiving the polarized keying tab upon correct insertion.

According to some examples for the apparatus, the connector housing may include an insertion stop to limit a distance the paddle board may be inserted in the paddle card receptor.

In some examples for the apparatus, the connector housing may include finger grips on opposing sides to facilitate insertion of the second edge portion in the paddle card receptor.

According to some examples for the apparatus, the connector housing may include one or more lead-in chamfers to facilitate insertion of the second edge portion in the paddle card receptor.

In some examples for the apparatus, the metal enclosure may be capable of connecting to a printed circuit board via one of a solder-in connection or a plurality of press-fit connectors capable of being press-fitted to holes in the printed circuit board.

According to some examples for the apparatus, the plurality of press-fit connectors may be arranged such that a second metal enclosure capable of enclosing at least a portion of a second connector housing is capable of being connected to an opposing side of the printed circuit board in a belly-to-belly configuration.

In some examples for the apparatus, a transceiver may be coupled between the first and second edge portions. For these examples, the first signals may include electrical signals and the second signals including optical signals. The transceiver may be capable of converting the electrical signals to the optical signals.

According to some examples for the apparatus, the first and second signals may each be capable of transmitting or receiving packets for four separate communication channels. For these examples, the four separate communication channels capable of being routed through the external fabric connector via the second plurality of signal pathways.

In some examples for the apparatus, the external fabric connector may be configured according to one or more specifications associated with Small Form Factor (SFF) Committee Specification SFF-8665, the external fabric connector configured as a quad small form-factor pluggable+(QSFP+) pluggable solution (QSFP28) connector.

In some examples, an example method may include guiding a first edge portion of a paddle card in a paddle card receptor for an external fabric connector. The paddle card receptor may be fixed to a printed circuit board. The paddle card may have a second edge portion coupled to a twin-axial cable that includes a first plurality of signal pathways to route first signals from a fabric controller integrated with a processor or processor package. The method may also include latching, via a connector latch, a connector housing that houses the paddle card to a metal enclosure fixed to the printed circuit board such that the first edge portion securely inserts in the paddle card receptor and the metal enclosure encloses at least a portion of the connector housing that houses the paddle card. The method may also include converting the first signals routed via the twin-axial cable to second signals following the latching of the connector housing to the metal enclosure. The second signals may be capable of being routed via a second plurality pathways included in the external fabric connector.

According to some examples, the method may also include transmitting or receiving packets over four separate communication channels via the first and second signals. The methods may also include routing the four separate communication channels through the external fabric connector via the second plurality of signal pathways.

In some examples for the method, converting the first signals routed via the twin-axial cable to second signals may include the first signals as electrical signals and the second signals as optical signals. For these examples, the electrical signals may be converted to the optical signals using a transceiver coupled between the first and second edge portions of the paddle card.

According to some examples for the method, the first edge portion of the paddle card in the paddle card receptor may be guided by one or more lead-in chamfers located on the connector housing.

In some examples for the method, latching the connector housing may include latching via a connector latch located on a top portion of the connector housing and attached to the connector housing via a hinged attachment. For these examples, the connector latch may have one or more latch retention features capable of being received in one or more respective slots in the metal enclosure.

According to some examples, the method may also include spring-loading the connector latch via an orientation of the connector latch in an upwardly angled position following receipt of the one or more latch retention features in the respective one or more slots. For these examples, responsive to a downward force on the connector latch, the spring-loaded connector latch may be caused to at least partially eject the first edge portion from the paddle card receptor.

In some examples, an example system may include a printed circuit board. The system may also include a paddle card receptor connected with the printed circuit board and coupled to an external fabric connector that includes a first plurality of signal pathways to route first signals. The system may also include a metal enclosure capable of connecting to the printed circuit board and enclose the paddle card receptor on four sides such that a first edge portion of a paddle card housed in a connector housing is capable of being inserted in the paddle card receptor through an open side of the metal enclosure. The metal enclosure may also be capable of enclosing at least the first edge portion following insertion in the paddle card receptor. The metal enclosure may be capable of shielding EMI associated with a conversion of the first signal to second signals to be routed to a fabric controller integrated with a processor or processor package.

According to some examples for the system, the second signals may be routed through a twin-axial cable having a second plurality of signal pathways configured to terminate at a second edge portion of the paddle card that is on an opposing edge of the paddle card in relation to the first edge portion.

In some examples for the system, the paddle card receptor connected with the printed circuit board and coupled to the external fabric connector may include the external fabric connector arranged according to one or more specifications associated with Small Form Factor (SFF) Committee Specification SFF-8665, the external fabric connector configured as a quad small form-factor pluggable+(QSFP+) pluggable solution (QSFP28) connector.

According to some examples for the system, the metal enclosure may include one or more slots to receive one or more latch retention features coupled with a connector latch position on top of the connector housing such that a secure connection between the connector housing and the metal enclosure is maintained following receipt of the one or more latch retention features in the respective one or more slots.

In some examples for the system, the metal enclosure may include a key hole to receive a polarized keying tab of the connector housing to facilitate correct insertion of the first edge portion in the paddle card receptor.

According to some examples for the system, the first and second signals may each be capable of receiving packets for a first set of four separate communication channels. For these examples, the first set of four separate communication channels may be capable of being separately routed through the external fabric connector via the first plurality of signal pathways.

In some examples, the system may also include a second paddle card receptor connected to the printed circuit board and coupled to a second external fabric connector that includes a third plurality of signal pathways to route third signals. For these examples, the system may also include a second metal enclosure capable of connecting to the printed circuit board and enclose the second paddle card receptor on four sides such that a first edge portion of a second paddle card housed in a second connector housing is capable of being inserted in the second paddle card receptor through an open side of the second metal enclosure. The second metal enclosure may also be capable of enclosing at least the first edge portion of the second paddle card following insertion in the second paddle card receptor. The second metal enclosure may be capable of shielding EMI associated with a conversion of the third signal to fourth signals to be routed to the fabric controller.

According to some examples for the system, the fourth signals may be routed through the twin-axial cable having a fourth plurality of signal pathways configured to terminate at a second edge portion of the second paddle card that is on an opposing edge of the second paddle card in relation to the first edge portion of the second paddle card.

In some examples for the system, the third and fourth signals may each be capable of receiving packets for a second set of four separate communication channels. For these examples, the second set of four separate communication channels may be capable of being routed through the second external fabric connector via the third plurality of signal pathways.

According to some examples for the system, the first and second metal enclosures may each be capable of connecting to the printed circuit board via one of a solder-in connection or a plurality of press-fit connectors capable of being press-fitted to holes in the printed circuit board.

In some examples for the system, the first and second metal enclosures may be connected to the same side of the printed circuit board.

According some examples, the system may also include a third and a fourth paddle card receptor that may each be separately connected to an opposing side of the printed circuit board and coupled to respective third and fourth external fabric connectors that separately include respective fifth and sixth plurality of signal pathways to route respective fifth and sixth signals. The system may also include a third metal enclosure and a fourth metal enclosure that may be separately capable of connecting to the printed circuit board and separately enclose respective third and fourth paddle card receptors on four sides such that first edge portions of respective third and fourth paddle cards housed in respective third and fourth connector housings are separately capable of being inserted in respective third and fourth paddle card receptors through an open side of the respective third and fourth metal enclosures. The third and fourth metal enclosures may also be capable of enclosing at least the first edge portion of the respective third and fourth paddle cards following insertion in respective third and fourth paddle card receptors. The third and fourth metal enclosures may be separately capable of shielding EMI associated with a conversion of the fifth and sixth signals to respective seventh and eighth signals to be routed to a second fabric controller integrated with the processor or processor package.

In some examples for the system, the seventh signal may be routed through a second twin-axial cable having a seventh plurality of signal pathways configured to terminate at a second edge portion of the third paddle card that is on an opposing edge of the third paddle card in relation to the first edge portion of the third paddle card. For these examples, the eighth signal may be routed through the second twin-axial cable having an eighth plurality of signal pathways configured to terminate at a second edge portion of the fourth paddle card that is on an opposing edge of the fourth paddle card in relation to the first edge portion of the fourth paddle card.

According to some examples for the system, the fifth and seventh signals may each be capable of receiving packets for a third set of four separate communication channels. For these examples, the third set of four separate communication channels may be capable of being routed through the third external fabric connector via the fifth plurality of signal pathways.

In some examples for the system, the sixth and eighth signals may each be capable of receiving packets for a fourth set of four separate communication channels. For these examples, the fourth set of four separate communication channels may be capable of being routed through the fourth external fabric connector via the sixth plurality of signal pathways.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   a connector housing;
   a paddle card resident within the connector housing, the paddle card having a first edge portion and a second edge portion, the first and second edge portions on opposing edges of the paddle card; and
   a twin-axial cable including a first plurality of signal pathways to route first signals from a fabric controller integrated with a processor or processor package to the first edge portion, the first signals capable of being converted to second signals following a coupling of the second edge portion with an external fabric connector including a second plurality of signal pathways to route the second signals.

2. The apparatus of claim 1, comprising:
   a metal enclosure capable of enclosing at least a portion of the connector housing that houses the paddle;
   a connector latch to secure the connector housing to the metal enclosure in a manner such that the second edge portion inserts in a paddle card receptor of the external fabric connector responsive to the connector housing being secured by the connector latch.

3. The apparatus of claim 2, comprising:
   the connector latch positioned on a top portion of the connector housing, the connector latch having one or more latch retention features;
   the metal enclosure including one or more slots to receive the respective one or more latch retention features such that a secure connection between the connector housing and the metal enclosure is maintained following receipt of the one or more latch retention features in the respective one or more slots.

4. The apparatus of claim 3, the connector latch capable of being spring-loaded in an upwardly angled position following receipt of the one or more latch retention features in the respective one or more slots such that a downward force on the connector latch causes the one or more latch retention features to disengage from the respective one or more slots in the metal enclosure and also cause the second edge portion to at least partially eject from the paddle card receptor.

5. The apparatus of claim 2, comprising the connector housing including a polarized keying tab to facilitate correct insertion of the second edge portion in the paddle card receptor, the metal enclosure capable of receiving the polarized keying tab upon correct insertion.

6. The apparatus of claim 2, comprising the connector housing including an insertion stop to limit a distance the paddle board may be inserted in the paddle card receptor.

7. The apparatus of claim 1, comprising the first and second signals each capable of transmitting or receiving packets for four separate communication channels, the four separate communication channels capable of being routed through the external fabric connector via the second plurality of signal pathways.

8. The apparatus of claim 1, comprising the external fabric connector configured according to one or more specifications associated with Small Form Factor (SFF) Committee Specification SFF-8665, the external fabric connector configured as a quad small form-factor pluggable+(QSFP+) pluggable solution (QSFP28) connector.

9. A method comprising:
   guiding a first edge portion of a paddle card in a paddle card receptor for an external fabric connector, the paddle card receptor fixed to a printed circuit board, the paddle card having a second edge portion coupled to a twin-axial cable including a first plurality of signal pathways to route first signals from a fabric controller integrated with a processor or processor package;
   latching a connector housing that houses the paddle card to a metal enclosure fixed to the printed circuit board such that the first edge portion securely inserts in the paddle card receptor and the metal enclosure encloses at least a portion of the connector housing that houses the paddle card; and
   converting the first signals routed via the twin-axial cable to second signals following the latching of the connector housing to the metal enclosure, the second signals capable of being routed via a second plurality pathways included in the external fabric connector.

10. The method of claim 9, comprising:
    transmitting or receiving packets over four separate communication channels via the first and second signals; and
    routing the four separate communication channels through the external fabric connector via the second plurality of signal pathways.

11. The method of claim 9, converting the first signals routed via the twin-axial cable to second signals comprises the first signals including electrical signals and the second signals including optical signals, the electrical signals converted to the optical signals using a transceiver coupled between the first and second edge portions of the paddle card.

12. The method of claim 9, comprising guiding the first edge portion of the paddle card in the paddle card receptor via guidance by one or more lead-in chamfers located on the connector housing.

13. The method of claim 9, latching the connector housing comprises latching via a connector latch located on a top portion of the connector housing and attached to the connector housing via a hinged attachment, the connector latch having one or more latch retention features capable of being received in one or more respective slots in the metal enclosure.

14. The method of claim 13, comprising:
    spring-loading the connector latch via an orientation of the connector latch in an upwardly angled position following receipt of the one or more latch retention features in the respective one or more slots; and
    responsive to a downward force on the connector latch, causing the spring-loaded connector latch to at least partially eject the first edge portion from the paddle card receptor.

15. A system comprising:
    a printed circuit board;
    a paddle card receptor connected with the printed circuit board and coupled to an external fabric connector that includes a first plurality of signal pathways to route first signals; and a metal enclosure capable of connecting to the printed circuit board and enclose the paddle card receptor on four sides such that a first edge portion of a paddle card housed in a connector housing is capable of being inserted in the paddle card receptor through an open side of the metal enclosure, the metal enclosure also capable of enclosing at least the first edge portion following insertion in the paddle card receptor, the metal enclosure capable of shielding electromagnetic interference (EMI) associated with a conversion of the first signal to second signals to be routed to a fabric controller integrated with a processor or processor package.

16. The system of claim 15, comprising the second signals routed through a twin-axial cable having a second plurality of signal pathways configured to terminate at a second edge portion of the paddle card that is on an opposing edge of the paddle card in relation to the first edge portion.

17. The system of claim 15, the paddle card receptor connected with the printed circuit board and coupled to the external fabric connector comprises the external fabric connector arranged according to one or more specifications associated with Small Form Factor (SFF) Committee Specification SFF-8665, the external fabric connector configured as a quad small form-factor pluggable+(QSFP+) pluggable solution (QSFP28) connector.

18. The system of claim 15, comprising the metal enclosure including one or more slots to receive one or more latch retention features coupled with a connector latch position on top of the connector housing such that a secure connection between the connector housing and the metal enclosure is maintained following receipt of the one or more latch retention features in the respective one or more slots.

19. The system of claim 15, comprising the first and second signals each capable of receiving packets for a first set of four separate communication channels, the first set of four separate communication channels capable of being separately routed through the external fabric connector via the first plurality of signal pathways.

20. The system of claim 15, comprising:
a second paddle card receptor connected to the printed circuit board and coupled to a second external fabric connector that includes a third plurality of signal pathways to route third signals; and
a second metal enclosure capable of connecting to the printed circuit board and enclose the second paddle card receptor on four sides such that a first edge portion of a second paddle card housed in a second connector housing is capable of being inserted in the second paddle card receptor through an open side of the second metal enclosure, the second metal enclosure also capable of enclosing at least the first edge portion of the second paddle card following insertion in the second paddle card receptor, the second metal enclosure capable of shielding EMI associated with a conversion of the third signal to fourth signals to be routed to the fabric controller.

21. The system of claim 20, comprising the fourth signals routed through the twin-axial cable having a fourth plurality of signal pathways configured to terminate at a second edge portion of the second paddle card that is on an opposing edge of the second paddle card in relation to the first edge portion of the second paddle card.

22. The system of claim 20, comprising the first and second metal enclosures each capable of connecting to the printed circuit board via one of a solder-in connection or a plurality of press-fit retention pins capable of being press-fitted to holes in the printed circuit board.

23. The system of claim 21, comprising:
a third and a fourth paddle card receptor each separately connected to an opposing side of the printed circuit board and coupled to respective third and fourth external fabric connectors that separately include respective fifth and sixth plurality of signal pathways to route respective fifth and sixth signals; and
a third metal enclosure and a fourth metal enclosure separately capable of connecting to the printed circuit board and separately enclose respective third and fourth paddle card receptors on four sides such that first edge portions of respective third and fourth paddle cards housed in respective third and fourth connector housings are separately capable of being inserted in respective third and fourth paddle card receptors through an open side of the respective third and fourth metal enclosures, the third and fourth metal enclosures also capable of enclosing at least the first edge portion of the respective third and fourth paddle cards following insertion in respective third and fourth paddle card receptors, the third and fourth metal enclosures separately capable of shielding EMI associated with a conversion of the fifth and sixth signals to respective seventh and eighth signals to be routed to a second fabric controller integrated with the processor or processor package.

24. The system of claim 23, comprising the seventh signal routed through a second twin-axial cable having a seventh plurality of signal pathways configured to terminate at a second edge portion of the third paddle card that is on an opposing edge of the third paddle card in relation to the first edge portion of the third paddle card, the eighth signal routed through the second twin-axial cable having an eighth plurality of signal pathways configured to terminate at a second edge portion of the fourth paddle card that is on an opposing edge of the fourth paddle card in relation to the first edge portion of the fourth paddle card.

25. The system of claim 24, comprising the fifth and seventh signals each capable of receiving packets for a third set of four separate communication channels, the third set of four separate communication channels capable of being routed through the third external fabric connector via the fifth plurality of signal pathways, the sixth and eighth signals each capable of receiving packets for a fourth set of four separate communication channels, the fourth set of four separate communication channels capable of being routed through the fourth external fabric connector via the sixth plurality of signal pathways.

* * * * *